US007874474B2

(12) United States Patent
Kim et al.

(10) Patent No.: US 7,874,474 B2
(45) Date of Patent: Jan. 25, 2011

(54) SELF-ASSEMBLY OF ELEMENTS USING MICROFLUIDIC TRAPS

(75) Inventors: Samuel Kim, Austin, TX (US); Ehsan Saeedi, Seattle, WA (US); Babak Amirparviz, Seattle, WA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 12/358,152

(22) Filed: Jan. 22, 2009

(65) Prior Publication Data

US 2009/0230174 A1 Sep. 17, 2009

Related U.S. Application Data

(60) Provisional application No. 61/022,769, filed on Jan. 22, 2008.

(51) Int. Cl.
*H05K 1/18* (2006.01)
*H05K 3/20* (2006.01)

(52) U.S. Cl. ......................... 228/175; 438/22; 438/107; 438/110; 257/622; 257/723

(58) Field of Classification Search ................. 228/175, 228/176; 156/297; 257/622, 623, 786; 438/22, 438/110, 116, 216
See application file for complete search history.

(56) References Cited

U.S. PATENT DOCUMENTS

| | | | | |
|---|---|---|---|---|
| 5,824,186 A * | 10/1998 | Smith et al. | ................. | 438/597 |
| 5,904,545 A | 5/1999 | Smith | | |
| 6,623,579 B1 | 9/2003 | Smith | | |
| 6,687,987 B2 | 2/2004 | Mayer | | |
| 6,731,353 B1 | 5/2004 | Credelle | | |

(Continued)

FOREIGN PATENT DOCUMENTS

WO WO 2007150066 A1 * 12/2007

(Continued)

OTHER PUBLICATIONS

Boehringer, K.F., et al., "Modeling of Capillary Forces and Binding Sites for Fluidic Self-Assembly," Proceedings of the 14th IEEE International Conference on Micro Electro Mechanical Systems [MEMS 2001], Interlaken, Switzerland, Jan. 21-25, 2001, pp. 369-374.

*Primary Examiner*—Jessica L Ward
*Assistant Examiner*—Devang Patel
(74) *Attorney, Agent, or Firm*—Christensen O'Connor Johnson Kindness PLLC

(57) ABSTRACT

A self-assembly process is disclosed for integrating free standing microcomponents onto a template having a plurality of binding sites, an interconnect network, and trapping structures disposed downstream of the binding sites. The self-assembly is accomplished by flowing a fluid medium containing the microcomponents over the template such that some of the microcomponents are trapped at binding sites. The template may be simultaneously (or subsequently) heated to melt a binder such as a solder spot at each of the binding sites, and then cooled to connect the trapped microcomponents to the interconnect network. In one embodiment, removable blocking elements are disposed upstream of some of the binding sites, for example formed from photoresist. After assembling a first set of microcomponents, the blocking elements are removed, and a second set of microcomponents in a fluid medium are flowed over the template for assembly into the newly unblocked binding sites.

18 Claims, 8 Drawing Sheets

U.S. PATENT DOCUMENTS 6,780,696 B1 * 8/2004 Schatz ........................ 438/216
6,790,692 B2 9/2004 Onozawa
6,982,819 B2 1/2006 Sawin
7,007,370 B2 3/2006 Gracias
7,018,867 B2 * 3/2006 Gracias ...................... 438/110
7,157,741 B2 1/2007 Kim
7,625,780 B2 12/2009 Jacobs
7,629,026 B2 12/2009 Sharma
2006/0223205 A1 * 10/2006 Jacobs et al. .................. 438/22
2006/0261432 A1 11/2006 Yoshimura
2007/0215273 A1 * 9/2007 Jacobs ........................ 156/297
2010/0096640 A1 4/2010 Kim

FOREIGN PATENT DOCUMENTS

WO 2008/086090 A1 7/2008

* cited by examiner

SELF-ASSEMBLY OF ELEMENTS USING MICROFLUIDIC TRAPS

CROSS-REFERENCE TO RELATED APPLICATION

This application claims the benefit of U.S. Provisional Patent Application No. 61/022,769, filed Jan. 22, 2008, the disclosure of which is hereby expressly incorporated by reference in its entirety.

STATEMENT OF GOVERNMENT LICENSE RIGHTS

This invention was made with U.S. Government support under Contract No. 7P50HG002360-06, awarded by the National Institutes of Health. The U.S. Government has certain rights in the invention.

BACKGROUND

Self-assembly is an attractive approach for the integration of heterogeneous Microsystems. Various microcomponents can be independently batch microfabricated and then integrated onto a template via self-assembly using a variety of mechanisms including fluid flow, gravity, and electromagnetic forces. Recent advances in microfabrication and fluidic self-assembly are disclosed in U.S. patent application Ser. No. 12/305,365 which is hereby incorporated by reference in its entirety.

Fluidic self-assembly is a promising method to construct distributed active systems that cover large areas, for example. These systems may be assembled on flexible substrates with a variety of heterogeneous components. Applications for macroelectronics include smart artificial skins, large area phased-array radars, solar sails, flexible displays, electronic paper and distributed x-ray imagers. A candidate macrofabrication technology must be able to integrate a large number of various functional components over areas exceeding the size of a typical semiconductor wafer, in a cost-effective and time-efficient fashion.

Flexible plastic substrates are an attractive substrate for macroelectronic systems, but such plastics are typically thermally and chemically incompatible with conventional semiconductor fabrication processes. A number of approaches have been explored for low-temperature integration of a large number of semiconductor components onto a plastic substrate. The integration of the semiconductors is typically followed by a number of additional steps to build and interconnect functional devices. These material integration methods have demonstrated functional devices on plastic built from amorphous silicon, low temperature polysilicon, and a number of organic semiconductors.

An alternative approach for construction of macroelectronic systems is to perform the integration at the device level, instead of the material level. Significant infrastructure is available to cost-effectively fabricate high performance devices on single crystal semiconductor substrates. Even though recent advances in robotic assembly allow for positioning of up to 26,000 components per hour on plastic substrates, the relatively moderate speed, high cost, and limited positional accuracy of these systems make them unsuitable candidates for cost-effective mass production of macroelectronics.

A powerful technology that can meet all the criteria for an effective macrofabrication technology is self-assembly. In a device-level integration approach based on self-assembly, functional devices are batch microfabricated to yield a collection of freestanding components. These components are then manipulated such that at least some of the components self-assemble onto a template, for example onto a flexible plastic substrate, to yield a functional macroelectronic system. Self-assembly, utilized in the fashion outlined above, is an inherently parallel construction method that provides the potential for cost-effective and fast integration of a large number of functional components onto substrates, including unconventional substrates. For example, self-assembly may be suitable for the integration of microcomponents made by incompatible microfabrication processes (e.g., light emitting diodes made in compound semiconductor substrates versus silicon transistors) onto flexible substrates.

Self-assembly of micron-scale components and/or millimeter-scale components ("microcomponents") have been studied previously both for two-dimensional and three-dimensional integration. In two-dimensional integration via self-assembly, a template with binding sites is prepared and a collection of parts is provided and manipulated to self-assemble onto the proper binding sites. The self-assembly procedure is typically performed in a liquid medium to allow for free motion of the microcomponents, and gravity and fluid dynamic forces are used to move the microcomponents and drive the system toward a minimum energy state.

A major drawback of prior art self-assembly methods has been the requirement for post-processing, for example the electrical interconnecting of the microcomponents after they have been self-assembled onto the template. Typically self-assembly of large numbers of components onto a substrate will produce a yield of less than 100% success, requiring additional post-processing to complete the assembly. In prior art methods, further processing of the substrate in a clean-room has been necessary to provide electrical connections and complete the assembly procedure. The need for extensive post-processing limits the applicability of prior art self-assembly methods when access to large areas and cost-effectiveness are determining factors. In order for the full potential of these techniques to be realized, batch microfabrication processes are needed to generate a large number of micron-scale functional components that can participate in self-assembly, and to increase the yield of the self-assembly process.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

A method of fluidic self assembly is disclosed that employs trapping to position microcomponents for reception at an associated binding site. A plurality of microcomponents are suspended in a fluid medium. A template having a plurality of binding sites interconnected with an interconnect network is provided. A plurality of traps or ridges are defined on a downstream side of one of the binding sites, wherein the ridge is sized to trap one of the plurality of microcomponents. A rigid panel is placed over the template such that a channel is defined between the template and the panel. The ridges or traps extend substantially across the channel. The fluid medium with the plurality of microcomponents is then flowed through the channel such that at least some of the microcomponents engage the traps such that the microcomponents are positioned at the associated binding site. The solder spot is heated such that the solder melts, and thereafter cooled thereby attaching the trapped microcomponents to the binding sites.

In an embodiment, a second rigid panel is provided under the template. In an embodiment, the template is formed with a pliable material, such as a PET plastic panel.

In an embodiment, the binding site comprises a recessed well that is sized and shaped to receive the microcomponent.

In an embodiment, the method further comprises including a number of removable blocking members disposed on an upstream side of some of the binding sites, and further comprising the steps of providing a second plurality of microcomponents suspended in a second fluid medium, removing the removable blocking members, and flowing the second fluid medium with the second plurality of microcomponents through the channel such that at least some of the second plurality of microcomponents are trapped on the template. The removably blocking members may comprise a photoresist.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

A fluidic self-assembly apparatus and method for assembly of a large number of small elements onto a template is disclosed. For example, the method may be used for the batch assembly of a large number of silicon field effect transistors and diffusion resistors onto a flexible plastic substrate or template, or to assembling a large number of light emitting diodes onto a plastic substrate to create a flexible display. The disclosed method allows for the integration of a very large number of microcomponents onto a relatively large-area template. The method may be applied to assembling small components, e.g., having a characteristic dimension on the order of microns, to relatively large microcomponents, e.g., having a characteristic dimension on the order of millimeters. The microcomponents may be electronic, optical or optoelectronic, micromechanical or the like.

As used herein the term "microcomponent" is defined to mean any component (electronic, optoelectronic, micromechanical or the like) having a characteristic length as small as micrometers to as large as several millimeters. In a particular embodiment, for example, disc-shaped microcomponents having a diameter of about 320 microns and a thickness of about 20 microns were fabricated as free-standing silicon components, resulting in a powder-like collection of microcomponents.

Figure 1A:
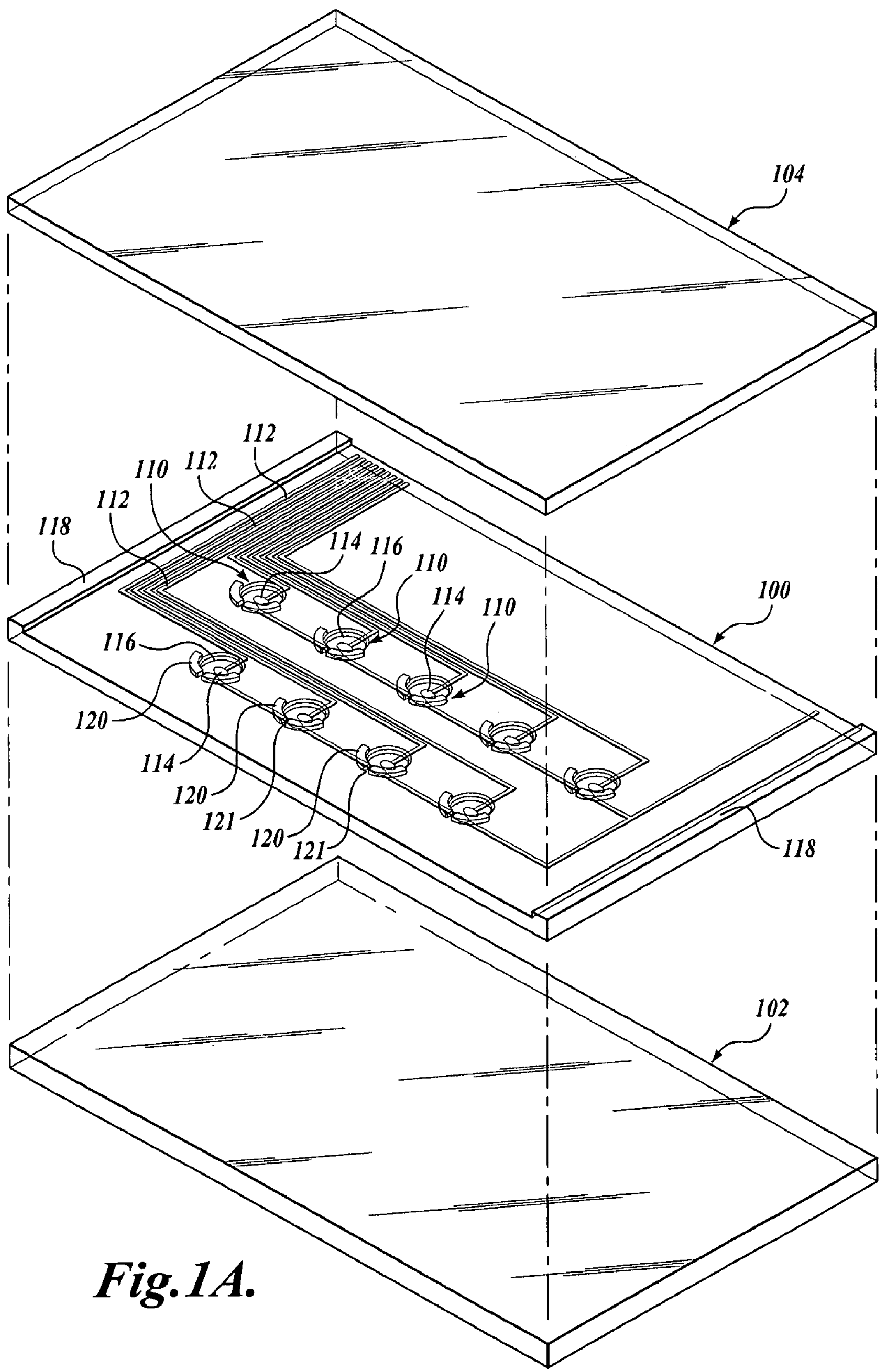
FIG. 1A is an exploded isometric view showing support structure and a template for fluidic self-assembly using trapping structures, in accordance with the present invention.

FIG. 1A shows an exploded isometric view of a template 100 and support apparatus for trapping-based fluidic self-assembly in accordance with the present invention. In this embodiment the support apparatus comprises a lower plate or floor 102 and an upper plate or ceiling 104. In a test apparatus, the lower plate 102 and upper plate 104 are transparent glass plates. This allows for visual inspection of the self-assembly process, and as discussed later, in some embodiments facilitates optical manipulation of the template 100.

The template 100 is held between the floor 102 and the ceiling 104. The template 100 may be formed on a conventional substrate such as silicon, or on an unconventional substrate. In one embodiment, for example, the template 100 is formed using a glass substrate. In another embodiment the template 100 is formed on a flexible plastic panel substrate, for example a sheet of polyethylene terephthalate ("PET").

Figure 1B:
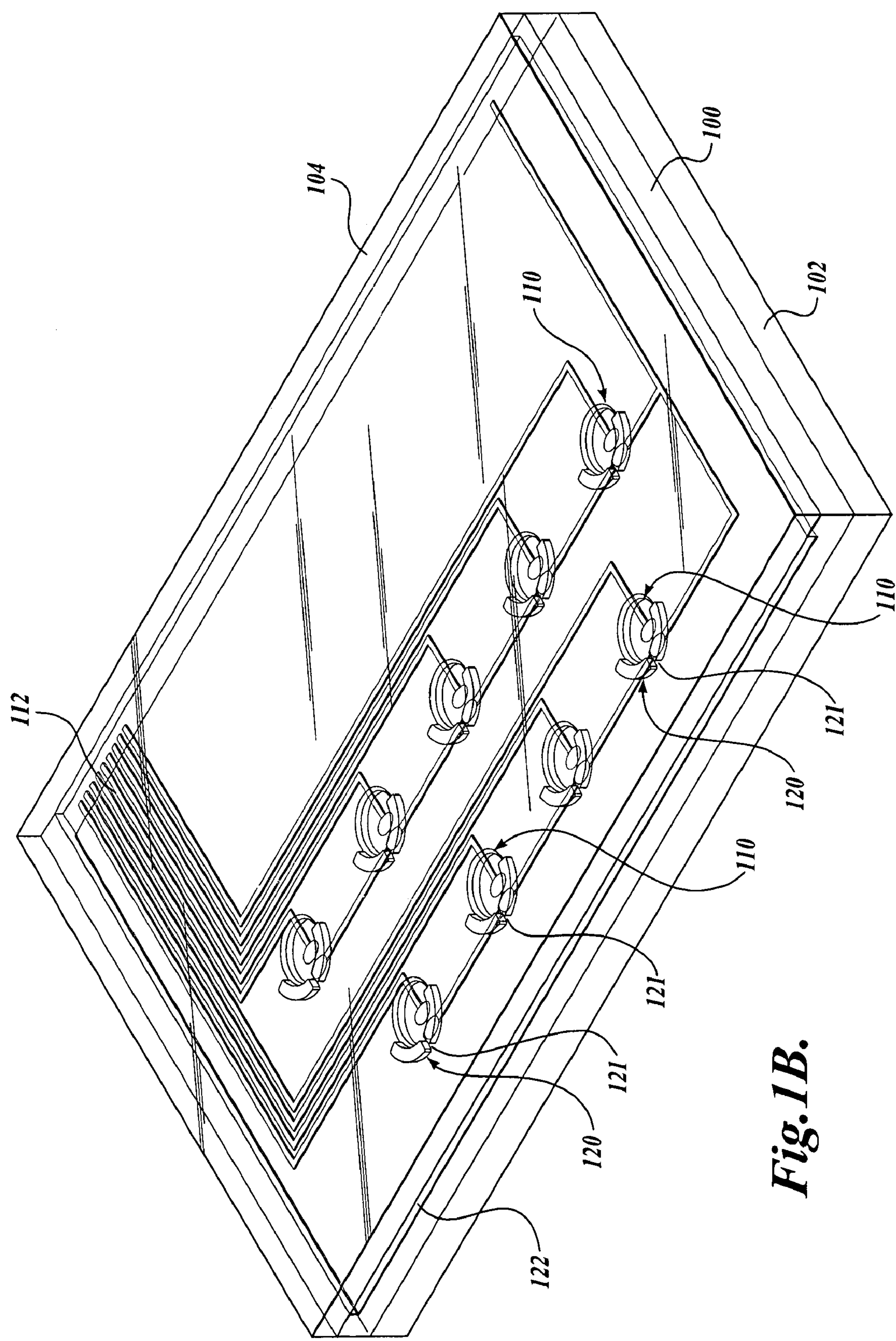
FIG. 1B is an isometric view of the assembled template and support apparatus shown in FIG. 1A.
Figure 1C:
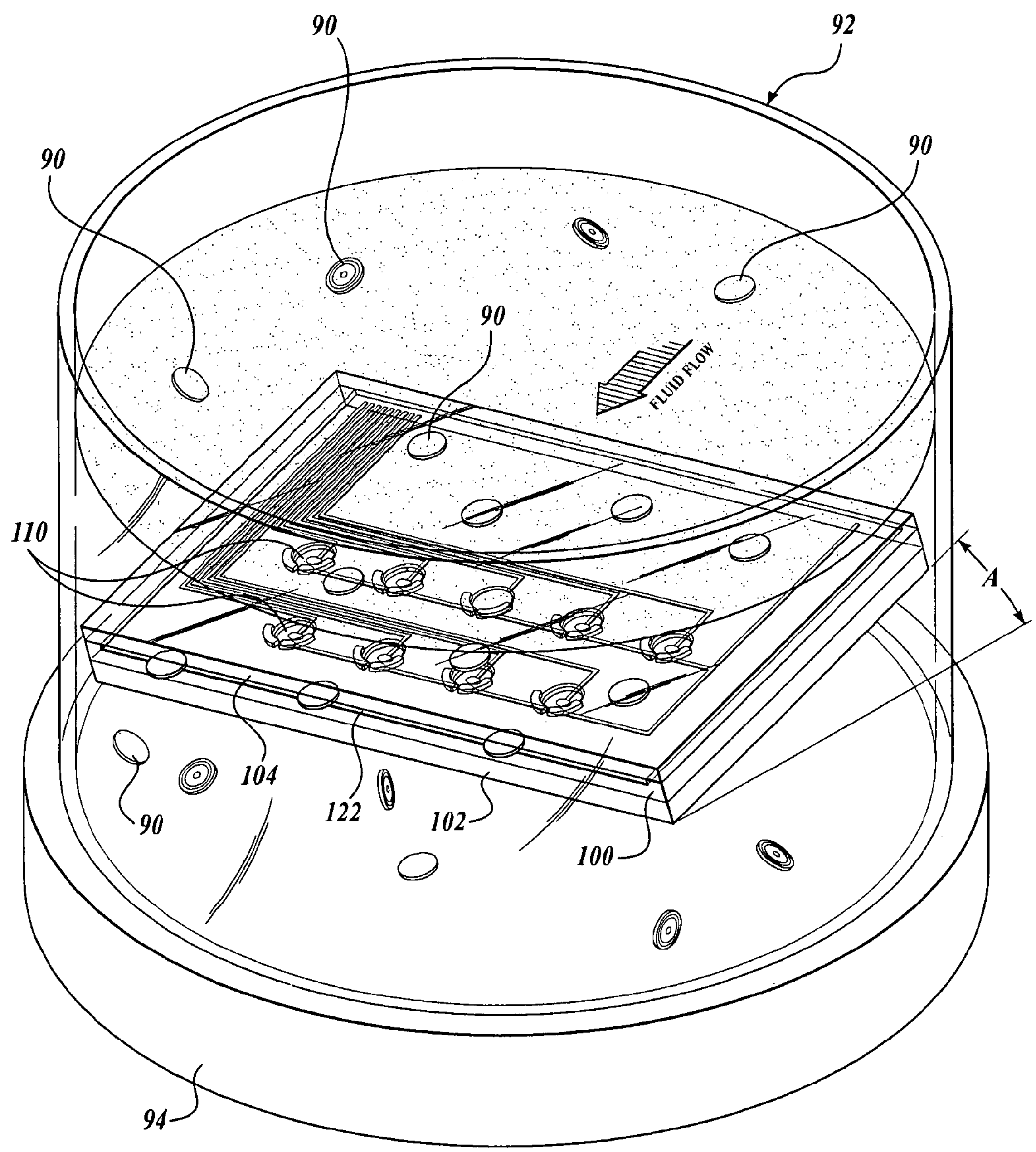
FIG. 1C is an environmental view showing the assembly from FIG. 1B, and associated apparatus for fluid self-assembly.

The template 100 defines a plurality of binding sites 110 (nine shown) that are adapted for receiving free-standing microcomponents 90 (FIG. 1C). Exemplary freestanding microcomponents 90 and a method for making such microcomponents 90 are disclosed, for example, in U.S. patent application Ser. No. 12/305365, which is incorporated by reference above. As discussed in more detail in the incorporated application, in fluidic self-assembly, the microcomponents 90 are suspended or disposed in a fluid medium which is induced to flow over the template 100, such that at least some of the microcomponents 90 are received into the binding sites 110.

A network of interconnects 112 are patterned on the template 100 substrate, interconnecting the binding sites 110. One or more binders such as solder spots 114 are also provided at the binding sites 110, for electrically connecting the microcomponents 90 to the interconnect 112 network. As used herein, a solder spot 114 is defined to be a small amount of conductive material for attaching the microcomponents to the interconnects 112, wherein the solder spot 114 can be selectively liquefied and solidified. For example, the solder spot 114 may comprise a small amount of a conventional low-temperature eutectic solder.

Optionally, and as shown in FIG. 1A, the binding site 110 may be recessed on the template 110, wherein the recess or well 116 is sized and shaped to receive one of the freestanding microcomponents 90, such that the installed microcomponent 90 is at least partially disposed within the well 116. In some applications, the wells 116 may be formed in different shapes to accommodate different microcomponents. It will be appreciated that a microcomponent 90 positioned over the well 116 may be drawn into the well 116 through capillary or other fluidic forces.

At each of the binding sites 110, a ridge or trap 120 is defined, that is sized and shaped to engage a microcomponent 90 in a desired position at the associated binding site 110. In the embodiment shown in FIG. 1A the traps 120 comprise a C-shaped ridge disposed on a down-stream side of the binding site 110, as discussed in more detail below. Optionally, opposed edges of the template 100 may also define ridges 118 that are similar in height to the traps 120.

FIG. 1B shows an assembled view of the template 100, and support apparatus comprising the floor 102 and ceiling 104. The apparatus may be held together in any convenient manner, for example with clamps, magnets, adhesives, etc., as are well-known in the art. The upper plate 104 preferably abuts, or nearly abuts, the traps 120, such that a narrow channel 122 is provided between the undersurface of the upper plate 104 and the template 100. The width of the narrow channel 122 is selected to allow the microcomponents 90 suspended in a fluid medium to enter the narrow channel 122, as indicated in FIG. 1C.

FIG. 1C shows the template 100 and support plates 102, 104 immersed in a fluidic self-assembly chamber 92. The self-assembly chamber 92 contains a fluid containing a large number of microcomponents 90. In practice, the fluid with the microcomponents 90 may be circulated through the chamber 92, for example by manually circulating the fluid and/or microcomponents or using suitable pumping equipment. In FIG. 1C a vibrating plate 94 supports the self-assembly chamber 92, and may be used to agitate the fluid to facilitate the self-assembly process. The microcomponents 90 and binding sites 110 are not shown to scale in FIG. 1C, and only a relatively few microcomponents 90 are shown for illustrative purposes. It should be appreciated that in certain exemplary embodiments it is contemplated that a large number microcomponents 90 would be suspended in the fluid, for example thousands of microcomponents 90 may be provided for a particular batch assembly process.

Figure 2:
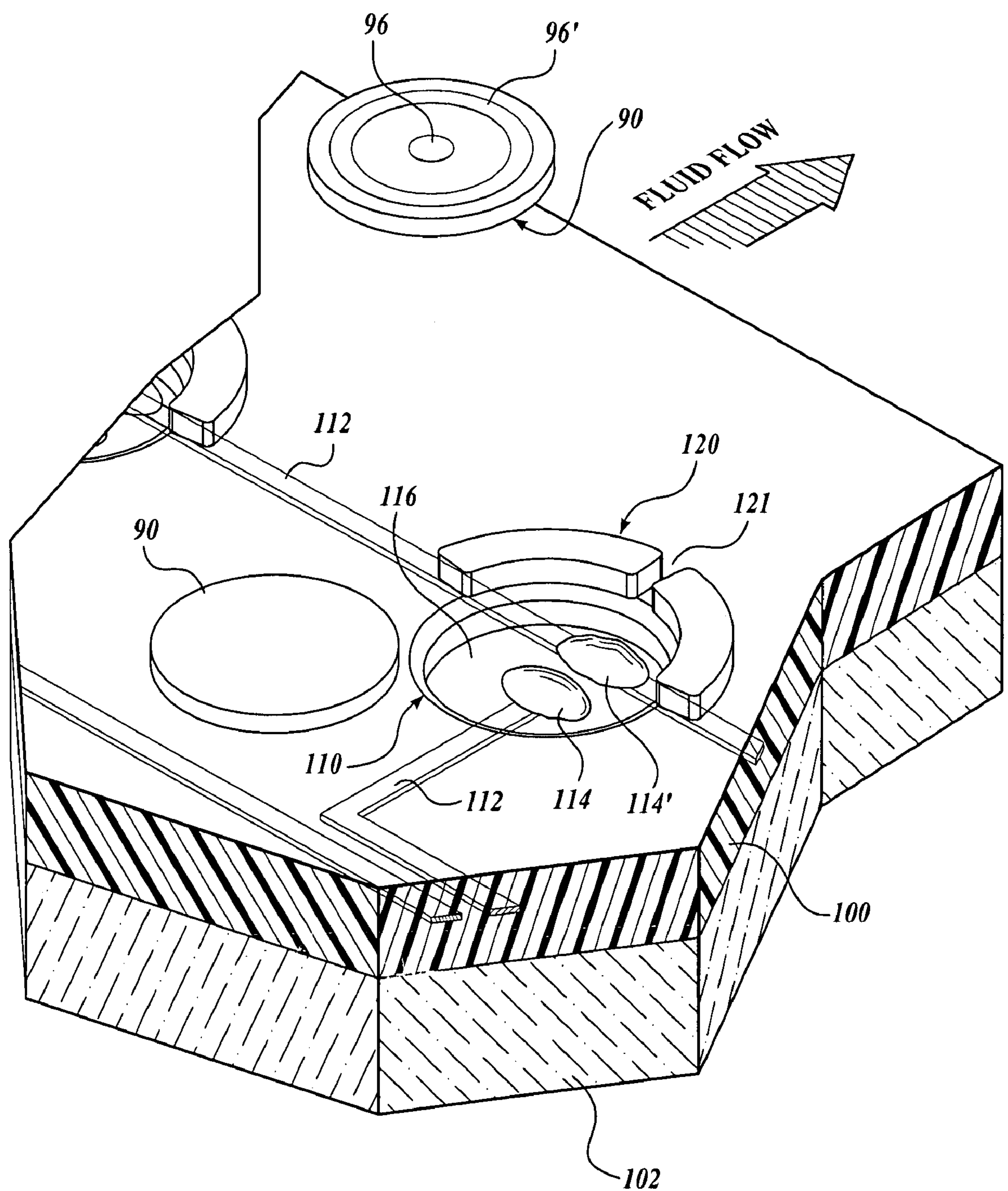
FIG. 2 is a detail view showing a close up of a binding site with the trapping structure for the template shown in FIG. 1.

FIG. 2 shows a close-up view of a binding site 110 and trap 120, with the ceiling 104 removed for clarity. The traps 120 engage the microcomponents 90 such that the microcomponents 90 are trapped against the fluid flow through the channel 122 generally over a binding site 110, positioning the microcomponent 90 for engagement of the binding site 110 interconnect 112. In this particular embodiment, the microcomponent 90 includes two terminals, a center terminal 96 which is positioned to engage a center solder spot 114 in a binding site 110, and an annular terminal 96' which is positioned to engage a second solder spot 114' in a binding site 110. It will be appreciated that in this arrangement a particular angular orientation of the microcomponent 90 is not required.

The fluid medium carries the microcomponents 90 through the channel 122 and over the template 100. The traps 120 engage the microcomponents against the fluid flow, positioning them correctly over their electrical connections. As shown in the FIGURES, an optional gap 121 is defined in the trap 120 to facilitate fluid flow through the trap 120.

The traps 120 can hold the microcomponents in place against the force of gravity when the template 100 is angled (as indicated by angle "A" in FIG. 1C). It is contemplated that the assembly process can take place in either a heated or a non-heated environment. In a heated environment the fluid is heated to a temperature sufficient to melt the solder spots 114. The solder spots 114 patterned into the binding sites 110 are therefore in a molten state during self-assembly and can wet the contacts of the microcomponent 90 as it engages the binding site 110.

When the self-assembly is done in a non-heated environment, the physical positioning of the microcomponents 90 is done while the solder spot 114 is in a solid state, and a second annealing step allows the microcomponents 90 to be wetted by the solder. The solder gives electrical contact to both the positive and negative contacts on each microcomponent 90 giving each microcomponent both electrical and mechanical connection to the template 100.

Although circular disc-shaped microcomponents have some advantages over other shapes, it will be appreciated, and it is contemplated by the present invention, that the microcomponents may be shaped differently. For example, square, triangular, oval, asymmetric, hexagonal, etc. microcomponents may be used with a complementary shaped trap, for example. Functionally distinct microcomponents may have different shapes to facilitate assembly of a device having heterogeneous microcomponents.

It is contemplated that the microcomponents 90 may be pre-oriented before introduction into the channel 122 such that the terminals 96, 96' are facing in a desired direction. For example, magnetic, optical, or buoyancy forces may be used to orient the microcomponents 90, or to sort the microcomponents according to the orientation of the terminals. Alternatively, the microcomponents may be fabricated with terminals on both the top and bottom sides, such that the microcomponents may be assembled in either of two orientations.

The trapping self-assembly process may be used with microcomponents fabricated on silicon substrates and/or with microcomponents made from different materials. For example, silicon microcomponents may be fabricated on a p-type SOI (silicon-on-insulator) wafer, as discussed in U.S. patent application Ser. No. 12/305365. Conventional lithography, metal evaporation, and lift-off processes may be used, for example, to define the electrical contacts on each microcomponent 90. Alternatively, other means known in the art may be used to pattern metal contacts, for example sputtering or the like. A photoresist mask is then patterned using a standard lithography process, and deep reactive ion etching ("DRIE") is used to define the shapes of the elements. Finally, a 49% HF bath etches the buried oxide layer to release the microcomponents from their substrates.

The template 100 may be formed on a rigid substrate such as glass or on flexible substrates, for example plastics, such as PET. Using well known fabrication processes, the template 100 may be fabricated on any suitable substrate, including other plastics, or crystalline materials such as silicon and III-V substrates. In the fabrication process for a template 100 formed on a PET substrate, for example, metal is evaporated for the interconnects 112 and electrical contacts, and layers of SU8 are used to define the shape of the wells 116 and the traps 120 for the binding sites 110. The template 100 is then dipped in a heated bath of a low melting point solder alloy, which coats the exposed portion of the interconnects 112 forming the metal contacts on the template 100, to deposit the solder spots 114.

In an exemplary embodiment, the template 100 is clamped tightly together between two glass slides defining the floor 102 and ceiling 104, while the apparatus is immersed in the self-assembly fluid to remove air bubbles and to provide a good seal.

It will be appreciated that the self-assembly fluid can serve multiple purposes to facilitate the self-assembly process. The main purpose of the fluid is, of course, to be a carrier for the microcomponents 90. Other considerations may also be used to select an optimal fluid, depending on the particular application. For example, the fluid may also serve as a fluxing agent to clean the surface of the solder spots 114 to promote wetting of the electrical contacts on the microcomponents 90 as well as on the template 100, thereby forming good electrical connections. However, the fluid used for self assembly does not need to serve multiple purposes and a fluid exchange process can be used to cycle different fluids through the system as needed.

As discussed above, the template 100 is sandwiched between the two glass plates 102, 104, wherein the upper plate 104 sits on top of, or very near, the top of the traps 120.

Therefore, as the fluid containing the microcomponents 90 is directed through the channel 122, the ceiling 104 prevents the microcomponents 90 from flowing over the traps 120.

It will be apparent to persons of skill in the art that the process may be automated using conventional components such as pumps, computer vision systems, heaters, pH meters, input/output modules, controllers, and the like. In particular, it is contemplated that the self-assembly fluidics may be sealed and pressurized to improve the fluid dynamics. Pressurizing the system provides advantages to the self-assembly process. Higher flow rates can be achieved, and the carrier fluid flow may be readily reversed during the self-assembly process, for example to avoid blockages or the like. In one embodiment, an oscillatory flow is superimposed on a directional flow through the channel 122 such that the bulk flow periodically and regularly reverses direction. Periodic reversal of the flow direction may be used, for example, to increase the yield by preventing or correcting the microcomponents from forming blockages in the channel 122.

Figure 3:
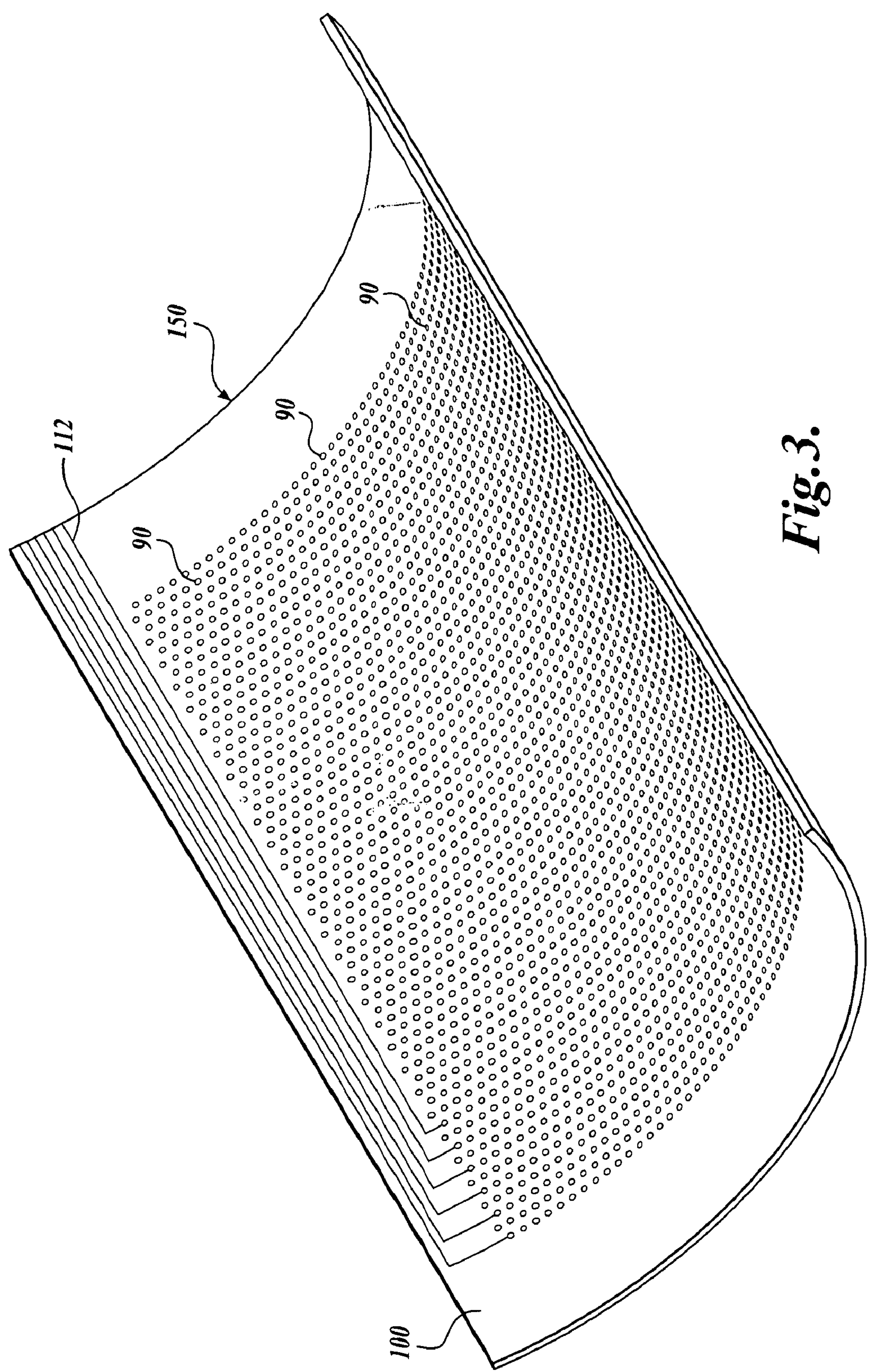
FIG. 3 illustrates an assembled device formed on a flexible substrate using the apparatus shown in FIG. 1.

An exemplary flexible device 150 made in accordance with the present invention is illustrated in FIG. 3. In this embodiment, a plurality of light emitting diodes or other display element, for example, may be self-assembled onto a flexible substrate, to form a flexible display. For clarity, not all of the interconnects 112 are shown in FIG. 3.

Trapping fluidic self-assembly, as disclosed herein, is an attractive approach for integrating heterogeneous microcomponents onto a template. For example, in an embodiment illustrated in FIG. 4, a template 200 is formed with two different-sized traps 220, 220', which may conveniently be C-shaped traps. The template 200 is otherwise similar to the template 100 discussed above.

In this embodiment, a first set of traps 220 are larger (e.g., larger in diameter) than a second set of traps 220'. In this embodiment, two different types of microcomponents are to be assembled onto the template 200. The first microcomponents 290 are formed with a larger diameter such that some of the larger microcomponents 290 are trapped by the first traps 220 for assembly at the associated first binding sites 210. By suitably sizing the traps 220 and microcomponents 290, the larger microcomponents 290 are not retained by the smaller second traps 220', but are carried by the fluid medium around the smaller traps 220'. The second microcomponents 290' are sized to be retained by the second set of traps 220', for assembly at the associated second binding sites 210'.

Figure 4:
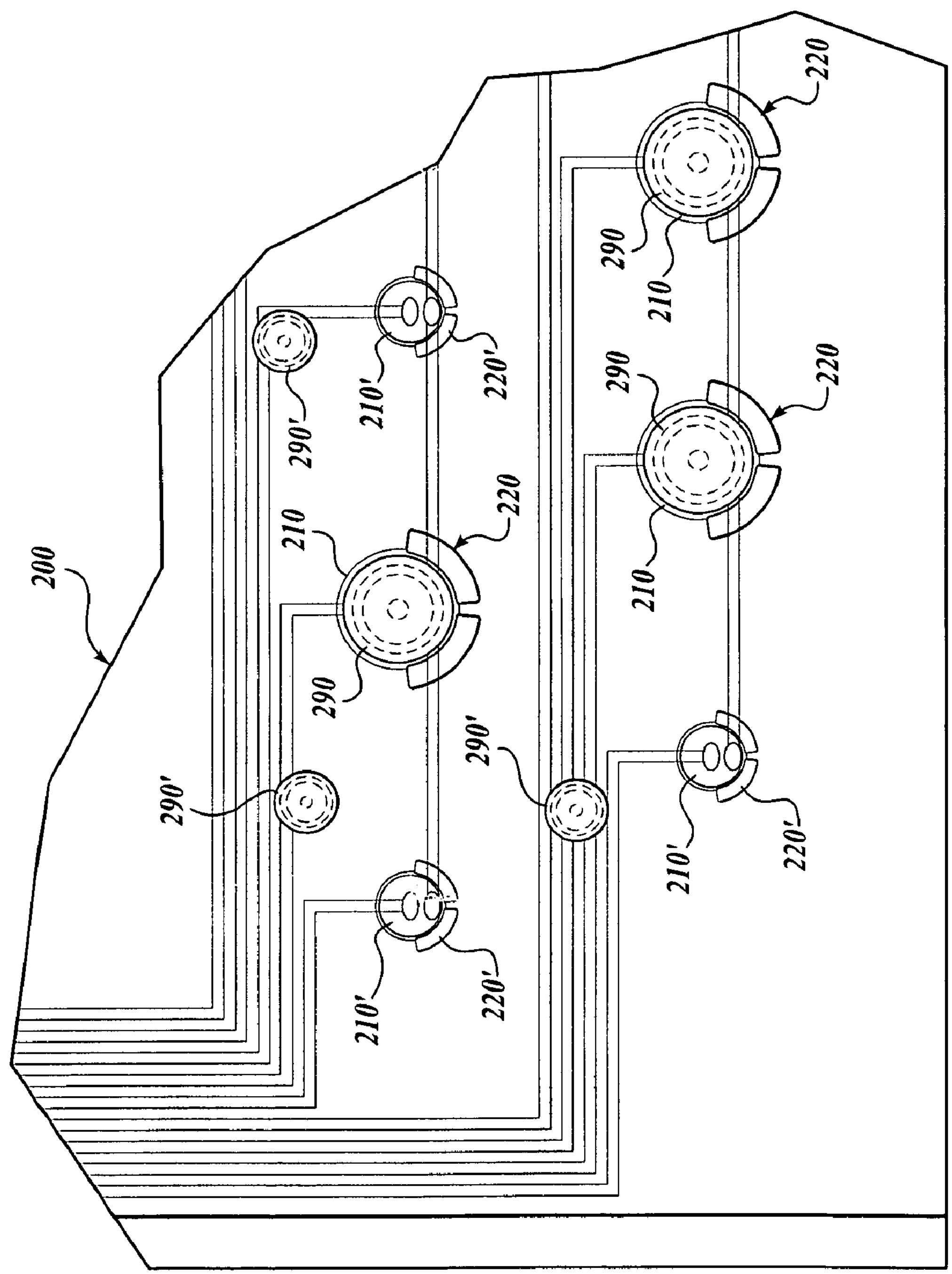
FIG. 4 is a fragmentary isometric view of a second embodiment of a template for fluidic self-assembly in accordance with the present invention, wherein the binding sites and traps have different sizes.

The fluidic self-assembly is then conducted in two steps. First the larger first microcomponents 290 are self-assembled to engage the larger binding sites 210 associated with the firsts traps 220. Then, the smaller second microcomponents 290' are fluidically delivered to the template 200 for self-assembled to engage the smaller binding sites 210' associated with the second traps 220'. The smaller microcomponents 290 are blocked from the larger binding sites 210 by the first microcomponents 290. FIG. 4 illustrates the process at the second step.

It will be apparent that more than two different size traps and binding sites may be used for assembling more than two different microcomponents onto a template. Although this second embodiment is illustrated with circular microcomponents, it will be appreciated that microcomponents (and binding sites) having different shapes may alternatively be used.

In another embodiment of the present invention removable blocking elements are used to facilitate assembling multiple heterogeneous microcomponents onto a template. In this embodiment, various microcomponents are batch microfabricated and then fluidically self-assembled onto a template having a plurality of binding sites and traps as discussed above, but wherein the microcomponents are introduced in stages, and some binding sites are temporarily blocked from receiving components during some of the stages.

Figure 5A:
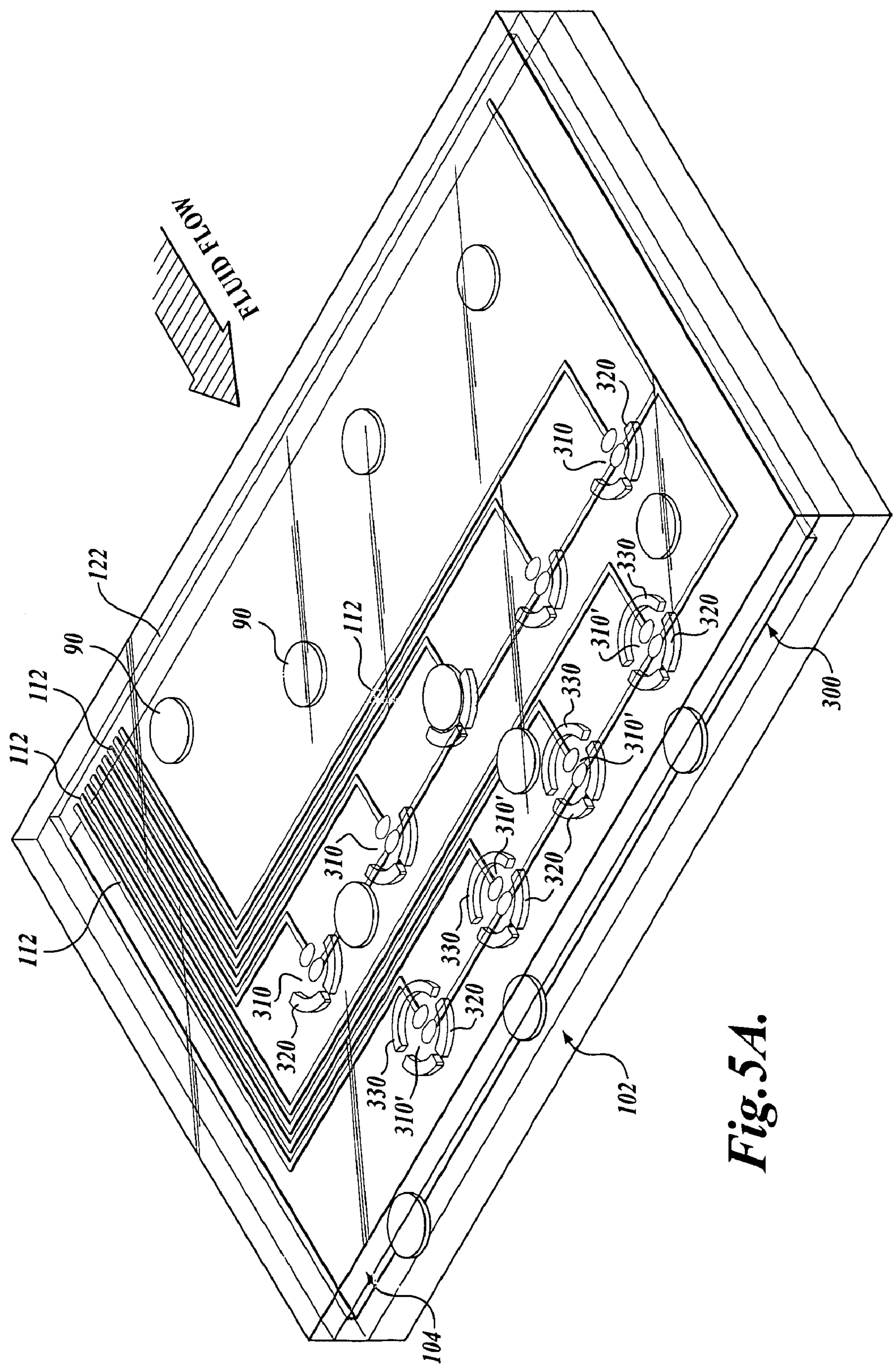
FIG. 5A illustrates another embodiment of an apparatus for trapping fluidic self-assembly in accordance with the present invention, wherein a portion of the binding sites include removable barriers.

FIG. 5A shows a template 300 sandwiched between the lower plate 102 and the upper plate 104, with a channel 122 defined between the template 300 and the upper plate 104. The template includes a network of interconnects 112, and binding sites 310, 310'. In this embodiment the binding sites 310, 310' are not recessed to show this option, although the embodiment of FIG. 5A could alternatively be practiced with recessed binding sites, as disclosed above. The binding sites 310, 310' include C-shaped ridges defining traps 320 that are sized and positioned to retain microcomponents 90 in a position to be received at the associated binding site.

Figure 5B:
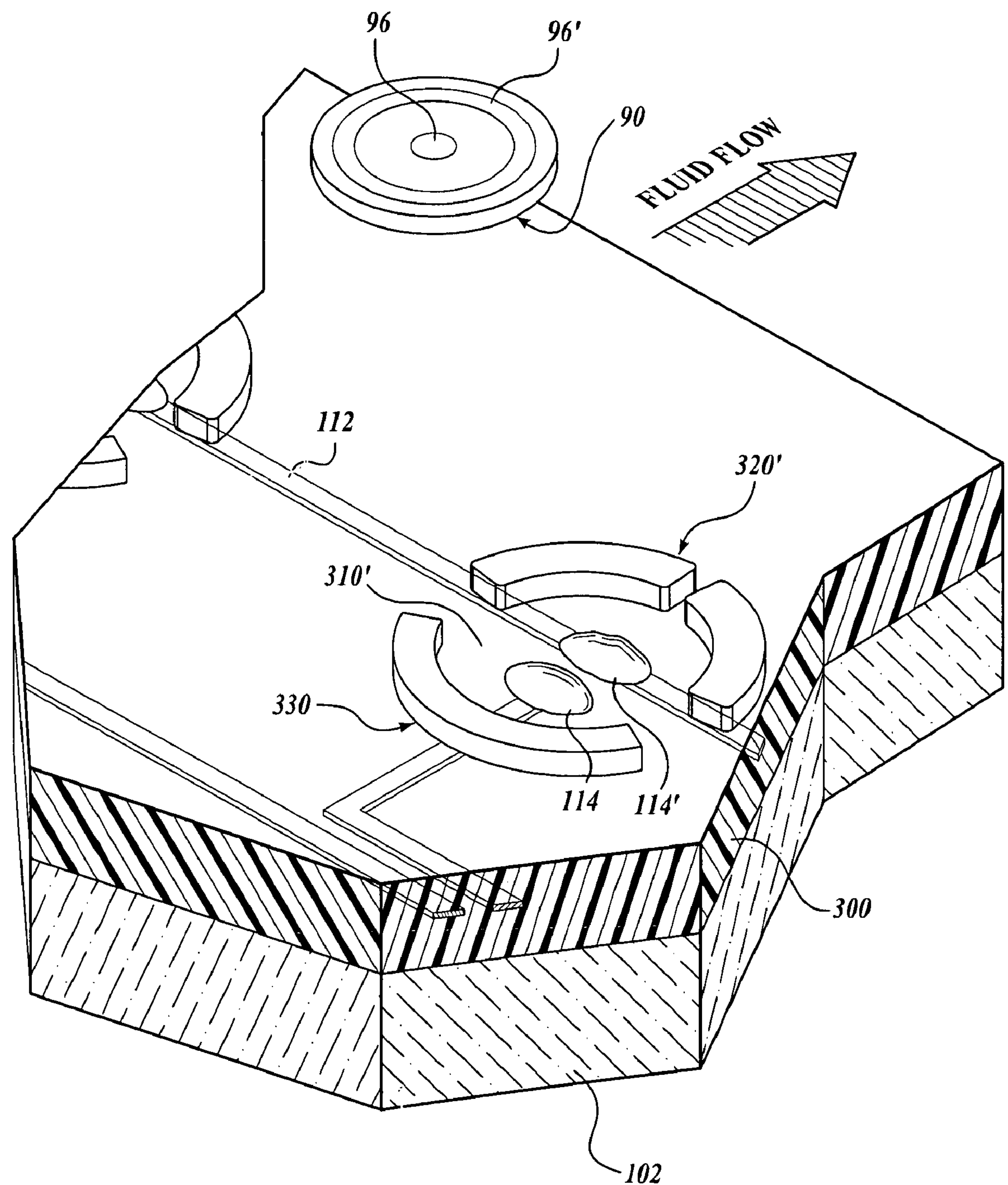
FIG. 5B is a fragmentary isometric view of a portion of the apparatus shown in FIG. 5A.

In this embodiment, some of the binding sites 310' include a blocking element 330 upstream of the binding site 310'. A detail view of a binding site 310' with a blocking element 330 is shown in FIG. 5B. When a first plurality of microcomponents 90 are fluidically delivered through the channel 122, the microcomponents 90 will only be retained by traps 320 that are not blocked. After the unblocked binding sites 310 are sufficiently filled with microcomponents 90, the blocking elements 330 associated with some or all of the remaining binding sites 310' are removed, and a second plurality of microcomponents, typically different from the first plurality of microcomponents 90, may be fluidically delivered through the channel 122, for assembly at the previously blocked binding sites 310'.

It will be appreciated that the first binding sites 310, which have already received the microcomponents 90 are thereby unable to receive any of the second set of microcomponents. This process may be conducted in more than two steps, wherein at an intermediate step only some of the blocking elements 330 are removed. In a third step, additional blocking elements 330 are removed prior to delivering a third plurality of microcomponents.

In particular, it is possible to program or "activate" the binding sites 310, 310' by using a programmable material, for example an ultraviolet (UV) sensitive materials such as a photoresist. Using standard lithography processes, the photoresist can be selectively patterned to form the blocking element 330 upstream of some of the microfluidic traps 320, such that a microcomponent 90 cannot be positioned at the associated binding site 310. The microcomponents 90 will therefore bypass the blocked binding sites and proceed further downstream, perhaps to engage other traps that are not blocked with a photoresist blocking element 330. After the unblocked traps 320 have been filled, a next set of blocked traps 310' can be activated by selectively exposing the desired blocking elements 330 to UV light and then flowing a developer solution through the channel 122. The developer solution would remove the photoresist that has been exposed to UV light, and thereby unblock the associated traps, such that subsequently introduced microcomponents may be engaged. In this way, an arbitrary number of distinct microcomponents may be sequentially assembled onto a single template 300.

It is contemplated that the lithography system can be a maskless lithography system, to allow for dynamic control of the mask. It is also contemplated that the developer solution for removing the UV-exposed blocking elements may be the fluidic medium that carries the micro components to their receptor sites. In this way, it is possible to always be activating receptor sites, depending on what element is approaching it. This would be particularly advantageous, for example, in a closed loop control system that is coupled with an imaging system. It is contemplated that the system would monitor the self-assembly progress and automatically activate new sites as necessary.

As an example of the method, in one embodiment of optical programming of the self-assembly process, an ZA4620 resist was patterned onto the template to cover or provide blocking elements to the binding sites to block the self-assembly at the blocked sites. An optical mask and UV exposure was applied, and a developer was cycled through the channel to remove the AZ blocking elements from some of the binding sites before each step of self-assembly. More particularly, (i) The template was fabricated with binding site wells and associated traps; (ii) AZ resist was spin-coated and patterned to cover the binding sites, except for a first set of binding sites; (iii) A first type of microcomponent was fluidically self-assembled into the first set of binding sites; (iv) A thin layer of AZ resist was spin-coated onto the template to protect the assembled microcomponents; (v) an optical mask, UV exposure, and photoresist developer were then used to remove the AZ blocking elements from a second set of binding sites; (vi) A second type of microcomponents was fluidically self-assembled into the second set of binding sites; (vii) steps (iv) and (v) were repeated until all of the microcomponent types had been self-assembled onto the template. By repeating these steps, an arbitrary number of different microcomponents may be assembled onto a single template.

By using different fluids for the fluidic medium which carry the microcomponents through the channel, and the fluid which is in the array, the entry of the elements into the array can be facilitated. Because one of the embodiments of uses is a ceiling, the channel created can be only a few microns in height. This makes it difficult to introduce the elements into this capillary channel. However, by using fluids with different viscosities, for example, we can allow the fluids to displace each other more readily, which allows the carrier fluid to flow into the channel.

It is contemplated that the method may be employed without a ceiling for a self-assembly process, wherein the fluid containing the microcomponents is made to flow over an uncovered template. The inventors have demonstrated a high yield achievable for microcomponents without using a ceiling. The need for a ceiling will depend in part on whether or not the traps will induce the microcomponents to sink into/onto the binding sites, rather than flowing over the trap. If the mass and flow rate combination is suitable, the microcomponent will sink as long as it can overcome other forces such as surface tension and capillary forces. However, this may reduce the throughput since for very low mass elements, the flow rate will have to be very slow. In these situations, the use of a ceiling might be necessary in order to go to higher flow rates.

It is contemplated that solders, oils, self-assembled monolayers ("SAMs"), or other patternable materials may be used to function as the trap. For solder, this can be done by simply patterning an array of metal pads which have the desired shape of the microfluidic trap and using a solder dipping process to pattern the array of solder traps. In this scheme, the metal contacts on the microcomponents could be formed on the side of the microcomponents instead of on a lower face. This can be achieved by using a mask which overlaps the edge of each element during the metal deposition process. By sputtering on the metal contacts, we can get a conformal coating to deposit metal onto the sides of the elements.

While the preferred embodiment of the invention has been illustrated and described, it will be appreciated that various changes can be made therein without departing from the spirit and scope of the invention.

The invention claimed is:

1. A method of fluidic self assembly comprising the steps:

providing a plurality of microcomponents suspended in a fluid medium, each microcomponent having a terminal;

providing a template comprising a substrate having a plurality of binding sites, each binding site having a solder spot, and an interconnect network connecting the plurality of binding sites, wherein the template defines a plurality of ridges defining traps, each ridge disposed on a downstream side of one of the plurality of binding sites, wherein the ridge is sized to trap one of the plurality of microcomponents;

providing a panel over the template and adjacent the ridges such that a channel is defined between the template and the panel wherein the plurality of ridges extend substantially across the channel;

flowing the fluid medium with the plurality of microcomponents through the channel such that at least some of the plurality of microcomponents are trapped by the plurality of ridges, each trapped microcomponent being disposed at one of the plurality of binding sites with the terminal disposed adjacent the solder spot; and heating the solder spots such that the solder spots melt, and thereafter cooling the solder spots such that the solder spots solidify, thereby attaching the trapped microcomponents to the binding sites;

wherein the template further comprises a first number of removable blocking members disposed on an upstream side of a first number of the plurality of binding sites, and further comprising the steps of:

removing the removable blocking members;

providing a second plurality of microcomponents suspended in a second fluid medium;

flowing the second fluid medium with the second plurality of microcomponents through the channel such that at least some of the second plurality of microcomponents are trapped by the plurality of ridges.

2. The method of claim 1, further comprising providing a second panel under the template.

3. The method of claim 1, wherein the template is formed from a pliable material.

4. The method of claim 3, wherein the pliable material is a plastic.

5. The method of claim 3, wherein the panel comprises a glass plate.

6. The method of claim 1, wherein each of the plurality of binding sites further comprise a recessed well that is sized and shaped to receive one of the plurality of microcomponents.

7. The method of claim 6, wherein the recessed wells are circular wells, and the microcomponents are circular discs.

8. The method of claim 6, wherein the plurality of ridges are C-shaped.

9. The method of claim 8, wherein the C-shaped ridges comprise multiple spaced-apart portions defining a gap between the spaced-apart portions.

10. The method of claim 1, further comprising the step of periodically reversing the flow direction of the fluid medium.

11. The method of claim 1, wherein the removably blocking members comprise a photoresist.

12. The method of claim 11, wherein the step of removing the removable blocking members comprises exposing the blocking members to ultraviolet light and flowing a developer through the channel that dissolves the removable blocking members that have been exposed to ultraviolet light.

13. The method of claim 11, wherein the second fluid medium comprises a developer that dissolves the removable blocking members.

14. A self-assembly method for assembling microcomponents onto a template comprising the steps:

providing a template having a plurality of recessed binding sites, an interconnect network interconnecting the recessed binding sites, a binder for electrically connecting to the interconnect network, and a plurality of upstanding trapping structures, each trapping structure disposed directly downstream of one of the plurality of recessed binding sites;

placing a rigid panel directly over the template trapping structures such that a channel is defined between the panel and the template wherein the trapping structures extend substantially across the channel;

providing a plurality of free standing microcomponents that are sized and shaped to be received into at least one of the plurality of recessed binding sites;

depositing the microcomponents into a fluid medium and flowing the fluid medium and microcomponents through the channel such that at least one of the microcomponents is trapped over one of the plurality of binding sites by one of the plurality of trapping structures; and connecting the trapped microcomponent to the interconnect network with the binder;

wherein the template further comprises a removable blocking element disposed upstream of a first portion of the plurality of recessed binding sites, the method further comprising the steps:

removing the removable blocking elements;

providing a second plurality of free standing microcomponents that are sized and shaped to be received into at least one of the plurality of recessed binding sites in a second fluid medium;

flowing the second fluid medium and second plurality of microcomponents through the channel such that at least one of the second plurality of microcomponents is trapped over one of the plurality of binding sites by one of the plurality of trapping structures; and connecting the trapped microcomponent to the interconnect network with the binder.

15. The method of claim 14 wherein the template comprises a flexible plastic panel.

16. The method of claim 14, wherein the binder comprises a solder spot, and further wherein the step of connecting the trapped microcomponent to the interconnect network comprises heating the solder spot such that it is molten when the trapped microcomponent is disposed at the binding site, and then allowing the molten solder spot to solidify.

17. The method of claim 14, wherein the trapping structures comprise a C-shaped ridge.

18. The method of claim 14, wherein the blocking elements comprise a photoresist, and wherein the step of removing the removable blocking elements comprises exposing the blocking elements to ultraviolet light and flowing a developer through the channel.

* * * * *

UNITED STATES PATENT AND TRADEMARK OFFICE

CERTIFICATE OF CORRECTION

PATENT NO. : 7,874,474 B2
APPLICATION NO. : 12/358152
DATED : January 25, 2011
INVENTOR(S) : S. Kim et al.

It is certified that error appears in the above-identified patent and that said Letters Patent is hereby corrected as shown below:

| COLUMN | LINE | |
|---|---|---|
| 10<br>Claim 11 | 58 | "removably blocking members" should read<br>--removable blocking members-- |

Signed and Sealed this
Nineteenth Day of April, 2011

David J. Kappos
*Director of the United States Patent and Trademark Office*